United States Patent [19]

Lochner

[11] Patent Number: 4,731,704

[45] Date of Patent: Mar. 15, 1988

[54] ARRANGEMENT FOR MODIFYING ELECTRICAL PRINTED CIRCUIT BOARDS

[75] Inventor: Anton Lochner, Moosburg, Fed. Rep. of Germany

[73] Assignee: Siemens Aktiengesellschaft, Berlin and Munich, Fed. Rep. of Germany

[21] Appl. No.: 940,227

[22] Filed: Dec. 8, 1986

Related U.S. Application Data

[63] Continuation of Ser. No. 751,815, Jul. 5, 1985, abandoned.

[30] Foreign Application Priority Data

Sep. 3, 1984 [DE] Fed. Rep. of Germany ....... 3432360

[51] Int. Cl.$^4$ ............................................. H05K 7/06
[52] U.S. Cl. ..................................... 361/400; 29/832; 29/836; 29/837; 361/412
[58] Field of Search .................................. 29/830–832, 29/836–837; 174/68.5; 361/400–402, 412, 414

[56] References Cited

U.S. PATENT DOCUMENTS

| | | | |
|---|---|---|---|
| 4,238,527 | 12/1980 | Monnier et al. | 361/400 X |
| 4,379,318 | 4/1983 | Ootsuka | 361/400 X |
| 4,554,614 | 11/1985 | Van der Wiyst | 361/400 |
| 4,674,182 | 6/1987 | Igarashi | 29/837 |

FOREIGN PATENT DOCUMENTS

| | | | |
|---|---|---|---|
| 1439642 | 1/1969 | Fed. Rep. of Germany | 361/401 |
| 2343581 | 3/1975 | Fed. Rep. of Germany | 361/400 |
| 2650348 | 3/1976 | Fed. Rep. of Germany | 361/411 |
| 2755926 | 6/1978 | Fed. Rep. of Germany | 361/400 |
| 2900838 | 7/1980 | Fed. Rep. of Germany | 361/401 |
| 1464288 | 11/1966 | France | 361/400 |
| 842670 | 7/1960 | United Kingdom | 361/400 |

*Primary Examiner*—Arthur T. Grimley
*Assistant Examiner*—Jane K. Lau
*Attorney, Agent, or Firm*—Lawrence C. Edelman

[57] ABSTRACT

The modification of existing and assembled electrical printed circuit boards is accomplished by placing additional conductors between the lead wires (4) of the electrical components (2). These conductors are in the form of a printed conductor foil (3) which is placed on the support plate (1) of the printed circuit module. The ends of the conductors on the conductor foil (3) terminate in soldering eyelets which are soldered to the protruding lead wires (4). By this means all additional electrical connections can be made at one time and without the danger of routing errors.

2 Claims, 1 Drawing Figure

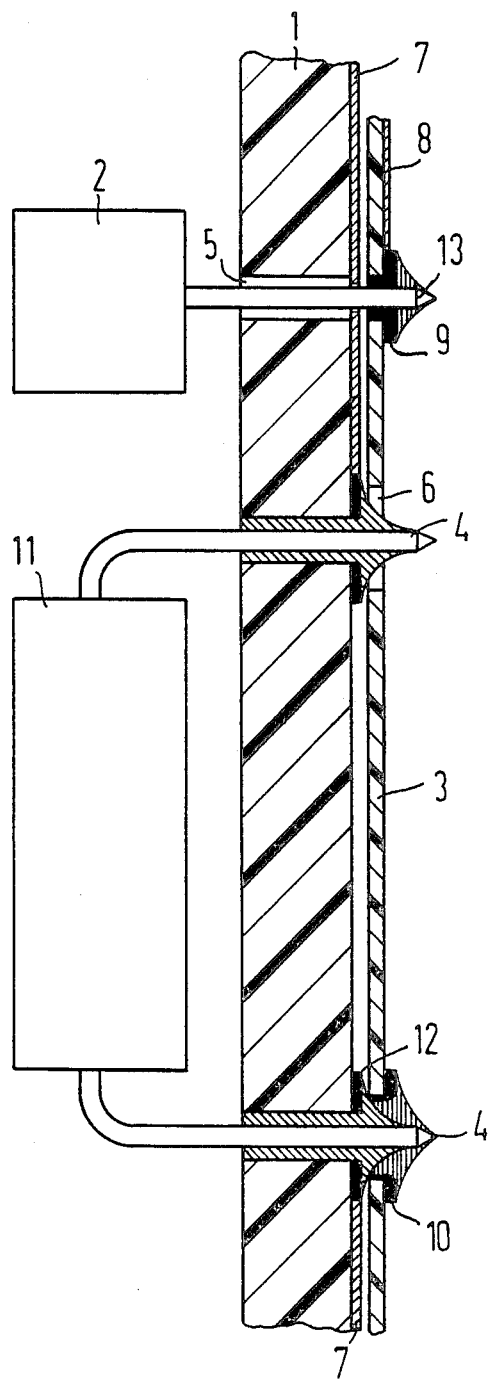

ARRANGEMENT FOR MODIFYING ELECTRICAL PRINTED CIRCUIT BOARDS

CROSS-REFERENCE TO RELATED APPLICATIONS

This is a continuation of Ser. No. 751,815, filed July 5, 1985, now abandoned.

BACKGROUND OF THE INVENTION

This invention relates to printed circuit boards, and, more particularly, it relates to an arrangement for modifying existing printed circuit boards including components mounted thereon such as the type employed in telephone switching applications.

In facilities employing telephone switching technology in particular, there is a recurring need to modify existing printed circuit boards of a given type. Such modifications are made predominantly to the electrical conductors. This is accomplished by removing the connections that are no longer necessary and replacing them with additional conductors in the form of insulated leads. These are attached to the relatively thick support plate of the printed circuit module by the linear or spaced application of adhesives. As a rule these modifications are carried out by the user by hand, in accordance with modification instructions provided by the supplier.

SUMMARY OF THE INVENTION

Broadly, the invention provides an arrangement for making the modification to the modules more simply, more reliably, at lower cost and more quickly.

According to one aspect of the invention, the added conductors are applied to the thick support plate at one time by the application thereto of a relatively thin support plate including printed circuit conductors formed thereon. The predetermined pattern of the printed circuit conductors provides the additional conductors in a printed and established form. By this means an incorrect placement of the added conductors is avoided in a dependable way. The connecting leads of the components extend through to the opposite or soldered side of the thick support plate. The thick support plate is made thinner than the height that the protruding ends of the component leads extend beyond the thick support plate. In this way the leads extend beyond the soldering eyelets and clearance holes in the thin support plate. The soldering eyelets of the thin support plate are then joined to the component leads by soldering and the thin support plate is also thereby mechanically fastened to the thick support plate.

Through the invention the necessity of connecting wires to the thick support plate is avoided. Such connecting wires are suitable for printed circuits, particularly in view of their mode of insertion which places a definite limit on thickness.

The thin support plates used for modifying a printed circuit modules are preferably produced in quantity at a central location and provided to the individual users. Since the placement of the thin support plate on the module to be modified no longer depends on a particular routing of wires, the modification may be carried out by less qualified personnel, e.g., the users. At the same time there is assurance that all added conductors run along predetermined paths so that the intended electrical operation is dependably retained. Subsequent modifications may also be carried out in the same way.

In a further aspect of the invention, insulated soldering eyelets are also provided on the thin support plate, in addition to those soldering eyelets that are integral with the added conductors. Insulated soldering eyelets are those that are not electrically connected with the added conductors, i.e., they are insulated from them and hence do not "see" them. Thus, soldering eyelets of this type are sometimes referred to as "blind" eyelets. The blind eyelets are soldered to the component leads of the module. These "blind" insulated soldering eyelets are located particularly at the corners of the thin support plate in order to form a dependable mechanical attachment to the thick support plate.

BRIEF DESCRIPTION OF THE DRAWINGS

The foregoing and other features and advantages of this will be more fully understood from the following description of an illustrative embodiment taken in conjunction with the accompanying drawing.

The sole FIGURE is a cross-sectional drawing of an illustrative arrangement for modifying printed circuit boards in accordance with the principles of the invention.

DETAILED DESCRIPTION

In the sole FIGURE, an illustrative embodiment of the invention is shown. The FIGURE illustrates by means of a schematic cross-section view an already modified electrical printed circuit (PC) board including a relatively thick component support plate 1 having component leads 4 passing therethrough from originally mounted components, the originally mounted components being represented by component 11, and a relatively thin support plate 3 having electrical conductors 8 formed thereon. For simplifying the illustrated embodiment, only one originally mounted component 11 and one added component 2 (to be described later on) are shown, although in practice there may be hundreds of originally mounted components and more than one added component.

As originally manufactured, thick component support plate 1 includes electrical signal conductors 7 on the side thereof which is opposite from the side of components 11. Electrical signal conductors 7 include soldering eyelets 12 integral therewith which are aligned with leads 4 of components 11 in order to provide good electrical connections between components 11 and electrical signal 7 and completes the electrical circuit of the unmodified PC board.

In accordance with the principles of the invention, the modification of the originally manufactured PC board is accomplished by the mounting on component support plate 1 of added components, the added components being represented by component 2. Components 2 have leads 13 passing through holes 5 drilled or otherwise formed in thick component support plate 1. A relatively thin conductor support plate 3 having electrical conductors 8 formed thereon is then attached to the electrical signal conductor 7 side of thick support plate 1 for providing the modifying, additional conductors between components 2 and/or 11.

When mounted on the conductor side of thick component support plate 1, conductors 8 engage aligned ones of leads 4 and/or 13 of components 11 and/or 2 for providing the modifying electrical connections therebetween.

Conductors 8 include soldering eyelets 9 therein at each aligned location where there is a connection to a lead 4 and/or 13 of one of components 11 and/or 2, respectively. For purposes of illustration, only one conductor 8 is shown for connecting lead 13 of component 2 to another component lead which is not shown and includes a soldering eyelet 9 which receives aligned leads 13 of components 2.

As previously noted, thin conductor support plate 3 is thin enough so that leads 4 and 13 of components 11 and 2 protrude out from thick component support plate 1 by an amount greater than the thickness of thin conductor support plate 3 thereby enabling subsequent soldering of leads 4 and/or 13 to soldering eyelets 9.

For the remaining ones of leads 4, i.e., those leads to which added conductors 8 are not to be electrically connected, thin conductor support plate 3 includes either one of a clearance hole 6 therein, so that selected ones of those leads 4 can pass through thin conductor support plate 3 without preventing thin conductor support plate 3 from being positioned approximate to thick component support plate 1 or, an insulated or "blind" soldering eyelet 10 therein, which allows selected ones of leads 4 of originally mounted components 11 to be soldered to the insulated soldering eyelets 10 so as to assist in firmly attaching thin support plate 3 approximate to thick support plate 1 while keeping these leads 4 electrically insulated from (i.e., "blind" to) the added conductors 8 of thin conductor support plate 3.

As previously noted, insulated soldering eyelets 10 are preferably located so as to be aligned with leads 4 which are near the corners of thin conductor support plate 3.

For ease and clarity of illustration in the FIGURE, the rightmost lead 4 of component 11 is representative of a group of leads 4 which is aligned with and passes through a group of clearance holes 6 in thin conductor support plate 3, and the leftmost lead 4 of component 11 is representative of a group of leads 4 which is aligned with and is soldered to a group of insulated soldering eyelets 10 on thin support plate 3.

There has thus been shown and described a novel arrangement for modifying printed circuit boards which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. An arrangement for modifying an electrical printed circuit board including a relatively thick support plate, components having component lead wires which extend through the thick support plate and conductors which are electrically connected to at least some of said component lead wires, comprising:
   an additional conductor which is to be connected to at least one of said component lead wires, the additional conductor being in the form of a printed conductor formed on a relatively thin support plate which is adapted for placement on the thick support plate, said thin support plate including at least one soldering eyelet integral with said additional conductor which is to be positioned over at least one of said component lead wires and soldered thereto and the thin support plate including at least one clearance hole and one insulated soldering eyelet for positioning over respective ones of at least two other of said component lead wires, said insulated soldering eyelet being positioned on said thin support plate so as to be aligned with one of said at least two other of said component lead wires and soldered thereto, for providing mechanical connection of said thick support plate to said thin support plate, said clearance hole being positioned on said thin support plate so as to be aligned with and allow an other one of said at least two other of said component lead wires to pass through said thin support plate without obstruction.

2. A method for modifying an electrical printed circuit board including a component support plate which has at least one original electrical component mounted on one side thereof and wherein lead wires of the electrical component protrude from the opposite side of said component support plate, by electrically connecting at least one lead wire of at least one additional electrical component to said at least one original electrical component, comprising the following steps:
   drilling a hole in said component support plate, the diameter of which is dimensioned for passing said lead wire of said additional electrical component therethrough;
   mounting said additional electrical component on said component support plate by passing said lead wire of said additional electrical component through said hole drilled during the prior step, so that said lead wire also protrudes from said opposite side of said component support plate;
   placing a conductor support plate which is relatively thin as compared to said component support plate, and which has conductors on one side thereof, on said opposite side of said support plate, said conductor support plate having an electrical signal conductor thereon, at least one component lead wire clearance hole therein, at least one soldering eyelet formed integrally with and electrically contacting said electrical signal conductor of said conductor support plate and at least one insulated soldering eyelet electrically isolated from said electrical signal conductor of said conductor support plate, said clearance hole and said insulated and integrally formed soldering eyelets being located in said conductor support plate such that when said conductor support plate is placed on said component support plate in this placing step, lead wires of said original and additional electrical components are aligned with and pass through a respective one of said clearance hole and said insulated and integrally formed soldering eyelets; and
   soldering said insulated and integrally formed soldering eyelets to said protruding ends of said lead wires of said original and added electrical components which are aligned therewith, such that an electrical connection is established to said added electrical component by the conductor of said conductor support plate and said integrally formed soldering eyelet, and said soldered insulated soldering eyelet provides mechanical attachment of said conductor support plate to said component support plate.

* * * * *